(12) United States Patent
Boe

(10) Patent No.: US 6,349,039 B1
(45) Date of Patent: Feb. 19, 2002

(54) APPARATUS FOR COUPLING COMPUTER COMPONENTS

(75) Inventor: Craig L. Boe, Nampa, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/066,503

(22) Filed: Apr. 23, 1998

Related U.S. Application Data

(63) Continuation-in-part of application No. 08/926,608, filed on Sep. 10, 1997, now abandoned.

(51) Int. Cl.[7] .................................................. H05K 7/14
(52) U.S. Cl. ..................... 361/801; 361/753; 361/759; 361/825; 24/290; 403/408.1
(58) Field of Search ................... 361/683–686, 361/732, 740, 741, 747, 748, 756, 759, 816–818, 800–802, 825; 24/290, 469; 403/408.1, 404

(56) References Cited

U.S. PATENT DOCUMENTS

| | | |
|---|---|---|
| 2,032,017 A | 2/1936 | Hocher et al. |
| 2,231,153 A | 2/1941 | Camiener |
| 2,311,410 A | 2/1943 | Meyer |
| 2,419,317 A | 4/1947 | Hall |
| 2,443,362 A | 6/1948 | Tinnerman |
| 2,590,264 A | 3/1952 | Meyers et al. |
| 2,627,385 A | 2/1953 | Tinnerman |
| 2,659,950 A | 11/1953 | West |
| 2,703,662 A | 3/1955 | Meyer |
| 2,868,486 A | 1/1959 | Poupitch |
| 3,154,281 A | 10/1964 | Frank |
| 3,216,580 A | 11/1965 | Fricker, Jr. |
| 3,303,394 A | 2/1967 | Peter et al. |
| 3,345,029 A | 10/1967 | Palmer |
| 3,368,780 A | 2/1968 | Buttriss ........................ 248/27 |
| 3,532,311 A | 10/1970 | Havener |
| 3,606,223 A | 9/1971 | Havener |
| 3,612,749 A | 10/1971 | Grube, Jr. et al. ...... 174/138 G |
| 3,613,177 A | 10/1971 | Davis ......................... 24/73 B |
| 3,652,899 A | 3/1972 | Henschen |
| 3,681,593 A | 8/1972 | Genovese et al. ....... 240/51.11 |
| 3,715,630 A | 2/1973 | Kuhl |
| 3,775,643 A | 11/1973 | Schachnow et al. |
| 3,829,741 A | 8/1974 | Athey |
| 3,909,908 A | 10/1975 | Brefka |
| 3,932,016 A | 1/1976 | Ammenheuser |
| 3,963,204 A | 6/1976 | Liss |
| 3,993,272 A | 11/1976 | Linderman |
| 4,046,443 A | 9/1977 | Champagne |
| 4,126,923 A | 11/1978 | Cislak et al. |
| 4,362,284 A | 12/1982 | Bolante |
| 4,383,716 A | 5/1983 | Osborn |
| 4,477,135 A | 10/1984 | Pronto |
| 4,577,818 A | 3/1986 | Clarisse ..................... 248/27.3 |
| 4,700,846 A | 10/1987 | Schroder |
| 4,745,524 A | 5/1988 | Patton, III |
| 4,756,495 A | 7/1988 | Putnam ..................... 248/27.3 |
| 4,786,121 A | 11/1988 | Lyons |
| 4,861,277 A | 8/1989 | Bina |

(List continued on next page.)

Primary Examiner—Jayprakash N Gandhi
(74) Attorney, Agent, or Firm—Perkins Coie LLP

(57) ABSTRACT

A device for coupling a one computer component, such as a printed circuit board and mounting bracket, to another computer component, such as a computer chassis. The device may comprise an engaging member and a fastener. The fastener may be configured to attach the engaging member to a fastener aperture in the chassis while the engaging member clamps the bracket against the chassis. The engaging member may have a protrusion sized and shaped to extend through an opening in the bracket and at least partially into an aperture in the chassis to restrict motion of the printed circuit board relative to the chassis. The engaging member may further include a plurality of protrusions to engage with and restrict motion of a corresponding plurality of printed circuit boards relative to the chassis.

20 Claims, 6 Drawing Sheets

U.S. PATENT DOCUMENTS

| | | |
|---|---|---|
| 4,874,977 A | 10/1989 | Safranek ................... 310/269 |
| 4,881,315 A | 11/1989 | Powell et al. |
| 4,906,201 A | 3/1990 | Young et al. |
| 4,909,752 A | 3/1990 | Hallum et al. |
| 4,949,934 A | 8/1990 | Krenz et al. |
| 4,998,828 A | 3/1991 | Hobbs |
| 5,015,802 A | 5/1991 | Chi ...................... 174/35 GC |
| 5,090,097 A | 2/1992 | Koester, Jr. et al. |
| 5,100,215 A | 3/1992 | Cooke et al. |
| 5,145,407 A | 9/1992 | Obata et al. |
| 5,191,514 A | 3/1993 | Kabat et al. |
| 5,193,792 A | 3/1993 | Di Marco |
| 5,236,157 A | 8/1993 | Reggiani ................... 248/27.1 |
| 5,258,889 A | 11/1993 | Belanger, Jr. |
| 5,262,923 A | 11/1993 | Batta et al. |
| 5,320,311 A | 6/1994 | Jensen et al. |
| 5,366,186 A | 11/1994 | Weyeneth |
| 5,461,541 A | 10/1995 | Wentland, Jr. et al. |
| 5,545,843 A | 8/1996 | Arvidsson et al. |
| 5,587,889 A | 12/1996 | Sacherman |
| 5,594,627 A | 1/1997 | Le |
| 5,596,170 A | 1/1997 | Barina et al. |
| 5,599,080 A | 2/1997 | Ho |
| 5,683,159 A | 11/1997 | Johnson |
| 5,731,955 A | 3/1998 | Bartanen et al. |
| 5,757,618 A | 5/1998 | Lee |
| 5,768,099 A | 6/1998 | Radloff et al. |
| 5,788,211 A | 8/1998 | Astier |
| 5,806,949 A | 9/1998 | Johnson |
| 5,828,547 A | 10/1998 | Francovich et al. |
| 5,829,601 A | 11/1998 | Yurchenco et al. |
| 6,049,963 A | 4/2000 | Boe |
| 6,158,594 A | 12/2000 | Boe |

APPARATUS FOR COUPLING COMPUTER COMPONENTS

CROSS-REFERENCE TO RELATED APPLICATIONS

This application is a continuation-in-part of pending U.S. patent application Ser. No. 08/926,608, filed Sep. 10, 1997, now abandoned and incorporated herein in its entirety by reference.

TECHNICAL FIELD

The present invention is directed toward an apparatus for coupling together computer components in the assembly of computers.

BACKGROUND OF THE INVENTION

Computers have several separate components including floppy disk drives, hard disk drives, CD-ROM drives, printed circuit boards (PCBs), and many other components. The components are typically manufactured separately from the computer housing or chassis, and then they are mounted in the computer chassis during final assembly. The chassis may be a floor mounted "tower" unit or a desk-mounted unit. In either case, the chassis may have a slot positioned to receive some components (e.g., a disk drive or CD-ROM drive), or the chassis may have a connector to receive other components (e.g., PCBs). Several components may be coupled to the chassis with a bracket. When the component is a disk drive or a CD-ROM drive, the slot in the chassis receives the bracket to couple the component to the chassis. When the component is a PCB, the bracket may be secured to the chassis using fasteners.

One conventional method for installing a plurality of PCBs in a computer chassis involves attaching a mounting bracket to each PCB and then individually connecting each bracket to the chassis with a threaded fastener. Each threaded fastener passes through an aperture in the bracket and is threaded into a threaded hole in the chassis to clamp the bracket to the chassis and restrict relative motion between the PCB and the chassis. Such a method may be employed by a manufacturer of custom computers to produce computers having various numbers of PCBs.

One drawback with the foregoing approach is that it may be time consuming to individually thread each fastener into its corresponding threaded hole. A further disadvantage is that the fasteners may fall into the spaces between neighboring PCBs and may be difficult to retrieve without damaging the PCBs or removing the PCBs from the chassis. Yet a further disadvantage of the foregoing approach is that a tool, such as a screwdriver or wrench required to install each fastener, may slip and damage the PCB or other components during installation. These drawbacks of individually threading each fastener into a corresponding hole are especially problematic for custom computer manufacturers that manually assemble each computer to order because each computer may have different types of components. As such, individually threading each fastener into each hole requires a significant amount of time that impacts the number of computers that can be assembled.

SUMMARY OF THE INVENTION

The present invention is directed toward coupling devices for coupling a first computer component to a second computer component. The first computer component may have a first aperture, and the second computer component may have a second aperture. A coupling device in accordance with one embodiment of the invention has an engaging member, a plurality of protrusions projecting from the engaging member, and a fastener coupled to the engaging member. The engaging member is configured to engage at least one of the first and second computer components, and the fastener is configured to attach the engaging member to one of the components. Additionally, when the engaging member is coupled to the first computer component, the protrusions are configured to extend at least partially into the apertures of the first and second computer components to restrict relative motion between the two computer components. As a result, many embodiments of coupling devices in accordance with the invention couple together two or more computer components with a single fastener.

In one embodiment, the fastener comprises a threaded screw or, in another embodiment, the fastener comprises a column having flexible flaps which may be operated without the use of a tool. In either embodiment, the protrusion may be biased toward the second component when the engaging member is coupled to the first component with the fastener.

In still another embodiment, the coupling device includes a support member connected to the engaging member. The support member is a resilient member that is also coupled to the fastener. The support member and the engaging member are then connected with the fastener to the first computer component. Because the support member is stiffer than the engaging member, or at least a resilient member, it biases the engaging member toward the first and second computer components.

DETAILED DESCRIPTION OF THE INVENTION

The present invention is directed toward coupling devices for removably coupling a first computer component to a second computer component. The coupling device may be used to couple a printed circuit board to a computer chassis, or couple together, for example, any of a myriad of other computer components. Many specific details of certain embodiments of the invention are set forth in the following description and in FIGS. 1–10 to provide a thorough understanding of such embodiments. One skilled in the art, however, will understand that the present invention may have additional embodiments, or that the invention may be practiced without several of the details described in the following description.

Figure 1:
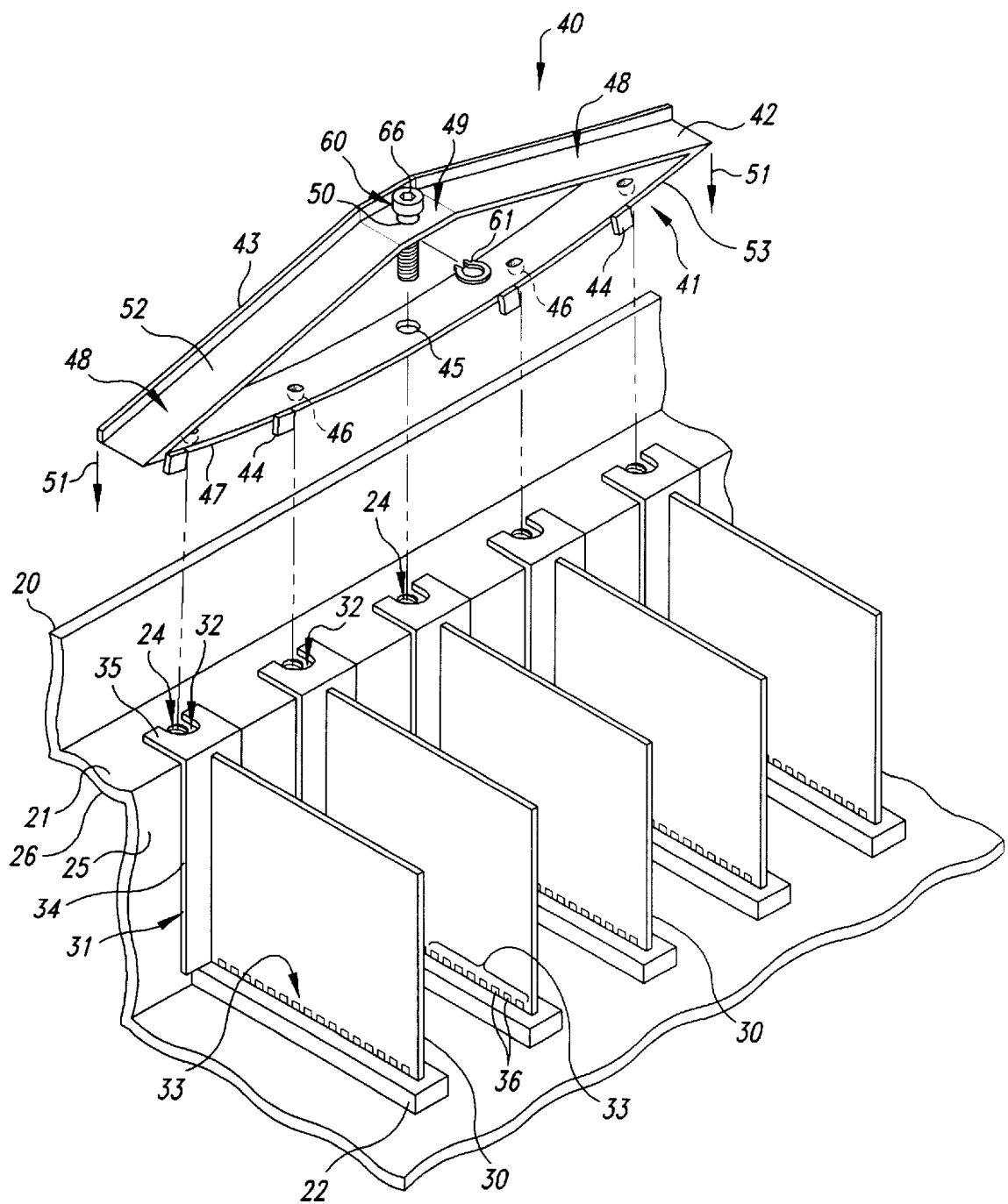
FIG. 1 is a top isometric view of a portion of a chassis having a plurality of printed circuit boards mounted thereto and a coupling device in accordance with an embodiment of the invention attaching the printed circuit boards to the chassis.

FIG. 1 is a top isometric view of a portion of a computer chassis 20 and a plurality of printed circuit boards (PCBs) 30 mounted to the chassis 20. The PCBs 30 are each attached to a mounting bracket 31. A coupling device 40 in accordance with an embodiment of the invention is fastened to the chassis 20 with a fastener 60 to contemporaneously clamp the mounting brackets 31 to the chassis 20 for restricting relative motion between the PCBs 30 and the chassis 20. The term fasten, when used herein in connection with the coupling device 40, is used to refer to any act of attaching the coupling device. For example, the coupling device 40, when fastened to the chassis 20, may clamp the mounting brackets 31 between the coupling device and the chassis, as discussed above. Alternatively, the coupling device 40 may be attached directly to a computer component with no intermediate devices, as is discussed below with reference to FIG. 10.

The chassis 20 includes a plurality of chassis connectors 22 configured to receive corresponding PCB connectors 33 of the PCBs 30. The PCB connectors 33 may comprise edge connectors with contact pads 36 to contact corresponding contact pads (not shown) in the chassis connectors 22. The PCBs 30 and the chassis 20, however, may also use pin connectors or other types of connectors.

The chassis 20 further includes a mounting surface 21 and an alignment surface 25, each positioned to engage the brackets 31 attached to the PCBs 30. Accordingly, the brackets 31 may have a generally L-shaped configuration with a vertical portion 34 attached to the PCB 30 and a horizontal portion 35. The vertical portion 34 is configured to abut the alignment surface 25, and the horizontal portion is configured to abut the mounting surface 21. The horizontal portion 35 includes a bracket aperture or slot 32. When the PCBs 30 are connected to the connectors 22, the bracket apertures 32 are aligned with corresponding threaded mounting apertures 24 positioned in the mounting surface 21. In the embodiment shown in FIG. 1, the bracket apertures 32 may be larger than the mounting apertures 24 to allow a fastener to pass easily through any of the bracket apertures 32. In another embodiment, the bracket apertures 32 may be smaller than the mounting apertures 24, as shown and described in greater detail below with reference to FIG. 2.

In one embodiment the coupling device 40 has an engaging member 41 and a support member 42. In this embodiment, the engaging member 41 includes an elongated bar 53 with a plurality of protrusions 46 projecting away from a lower surface 47 of the bar. The bar may comprise a high strength elastic material, such as a sheet metal. Or it may comprise other materials, including plastics and other synthetics. The protrusions 46 are spaced apart alone the engaging member 41 to be aligned with the corresponding mounting apertures 24 when the engaging member 41 is positioned adjacent the mounting surface 21. As shown in FIG. 1, each protrusion 46 may be a spherical knob that may accordingly be easily inserted into and/or removed from a corresponding mounting aperture 24. In other embodiments, the protrusions 46 may have other shapes. In the embodiment shown in FIG. 1, the protrusions 46 may be formed by dimpling or extruding the engaging member 41 with a punch and die, and in other embodiments, the protrusions may be formed by other means. For example, the protrusions 46 may comprise separate pieces which are each bonded to the lower surface 47 of the bar 53.

In the embodiment shown in FIG. 1, the engaging member 41 may also include a plurality of registration tabs 44 depending from the bar 53 and positioned adjacent each protrusion 46 to engage the vertical portion 34 of the bracket 31. The engaging member 41 also includes a fastener aperture 45 through which the fastener 60 can extend to fasten the coupling device 40 to the chassis 20.

The support member 42 may be elongated and attached at each end to corresponding ends of the engaging member 41. The engaging member 41 and the support member 42 may be integrally formed, for example, by cutting sections from the end of a hollow tube having a cross-sectional shape corresponding to the shape enclosed by the engaging member 41 and the support member 42. In one embodiment, the support member 4A has sloped end portions 48 that extend upwardly away from the engaging member 41, and an intermediate portion 49 positioned between the end portions 4S. The support member 42 may further include a stiffener 43 connected to the end portions 48 and the intermediate portion 49. The stiffener 43 may be integrally formed with the support member 42 or may be manufactured separately and attached to the support member. In one embodiment, the stiffener 43 is stiffer in a direction generally perpendicular to an upper surface 52 of the support member 42 than in the plane of the upper surface. The stiffener 43 may accordingly limit the tendency for the end portions 48 to bend relative to the intermediate portion 49.

The intermediate portion 49 may include an aperture 50 through which the shank of the fastener 60 can pass toward the engaging member 41. In the embodiment shown in FIG. 1, the fastener 60 can be a threaded cap screw having a head 66 that is larger than the aperture 50. The fastener 60 may further include a snap ring 61 that is positioned around the shank once the fastener has been inserted into the aperture 50 to prevent the fastener from inadvertently slipping out of the aperture 50. The snap ring 61 is generally spaced a sufficient distance from the support member 42 to allow the fastener 60 to rotate freely within the aperture 50.

Operation of an embodiment of the coupling device 40 is best understood with reference to FIG. 1. The user (not shown) connects the PCBs 30 to the chassis 20 by coupling the PCB connectors 33 to the chassis connectors 22. The user positions the brackets 31 of the PCBs 30 such that the vertical surfaces 34 thereof are adjacent the alignment surface 25 and the horizontal surfaces 35 thereof are adjacent the mounting surface 21 of the chassis 20. The user moves the coupling device 40 vertically downward, as indicated by arrows 51, until the protrusions 46 on the engaging member 41 are aligned with the bracket apertures 32 and the mounting apertures 24. The user may engage the registration tabs 44 with the vertical portions 34 of the brackets 31 to help align the engaging member 41 and the protrusions 46 relative to the mounting surface 21.

To attach the coupling device 40 to the chassis 20, the user threads the fastener 60 into the mounting aperture 24 with which it is aligned. As the fastener 60 is threaded into the corresponding mounting aperture 24, it draws the support member 42 toward the mounting surface 21. Because the support member 42 is reinforced by the stiffener 43, it tends to maintain its shape as it moves toward the mounting surface 21. Conversely, the unreinforced engaging member 41, which is initially bowed upwardly, tends to flatten and conform to the mounting surface 21 and horizontal portions 35 of the brackets 31. As the engaging member 41 flattens, the protrusions 46 move downward until they extend through the bracket apertures 32 and into the mounting apertures 24. The protrusions 46 are accordingly biased into the mounting apertures 24, and the lower surface 47 of the enraging member clamps the brackets 31 against the mounting surface 21.

An advantage of the coupling device 40 shown in FIG. 1 is that it significantly reduces the time and labor to assemble multiple computer components in the manufacturing of computers. Because a single fastener 60 may be used to couple a plurality of PCBs 30 to the chassis 20, several computer components can be coupled together in approximately the same amount of time required to connect fewer components using conventional devices and methods. For example, in one conventional method of attachment, each bracket 31 is individually coupled to the mounting surface 21 by threading a conventional machine screw, which may be similar to the fastener 60, through the mounting aperture 24 such that a head of the screw clamps the horizontal portion 35 of the bracket 31 against the mounting surface 21 in a conventional manner. Unlike conventional methods, the protrusions 46 may replace all but one of the plurality of fasteners upon coupling the single fastener 60 to the corresponding aperture 24. Accordingly, compared to conventional methods, the time required to attach and/or remove the PCBs 30 may be reduced. Furthermore, by reducing the number of fasteners required to attach the PCBs 30, the coupling device 40 may reduce the likelihood that the tool used to attach the PCBs will slip and damage the PCBs when the PCBs are installed or removed.

A further advantage of the coupling device 40 shown in FIG. 1 is that the sole remaining fastener 60 may be held in place relative to the coupling device by a snap ring 61. The snap ring 61 substantially reduces the tendency for the fastener 60 to separate from the device and fall between the PCBs 30 where the fastener, or efforts to retrieve the fastener, may damage the adjacent PCBs.

Figure 2:
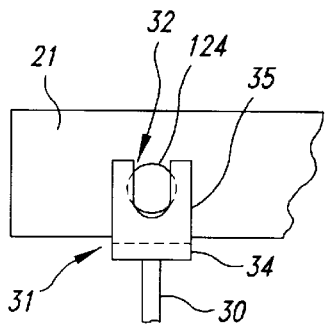
FIG. 2 is a top plan view of a portion of the chassis shown in FIG. 1, and a bracket attached to a printed circuit board and positioned to be mounted proximate a chassis aperture with a coupling device in accordance with another embodiment of the invention.

FIG. 2 is a top plan view of a bracket 31 and a portion of the mounting surface 21 shown in FIG. 1 having a mounting aperture 124 that is larger than the bracket aperture 32. Accordingly, when the protrusion 46 (FIG. 1) of the coupling device 40 (FIG. 1) is inserted into the mounting aperture 124, it tends to engage the walls of the bracket aperture 32. An advantage of this embodiment is that when the protrusion 46 engages the walls of the bracket aperture 32, it may further restrict the bracket 31 from moving relative to the mounting surface 21. In one aspect of this embodiment, the bracket aperture 32 and mounting aperture 124 may be sized such that the protrusion 46 engages both the walls of the bracket aperture 32 and the walls of the mounting aperture 124, further restricting relative motion between the bracket 31 and the mounting surface 21.

Figure 3:
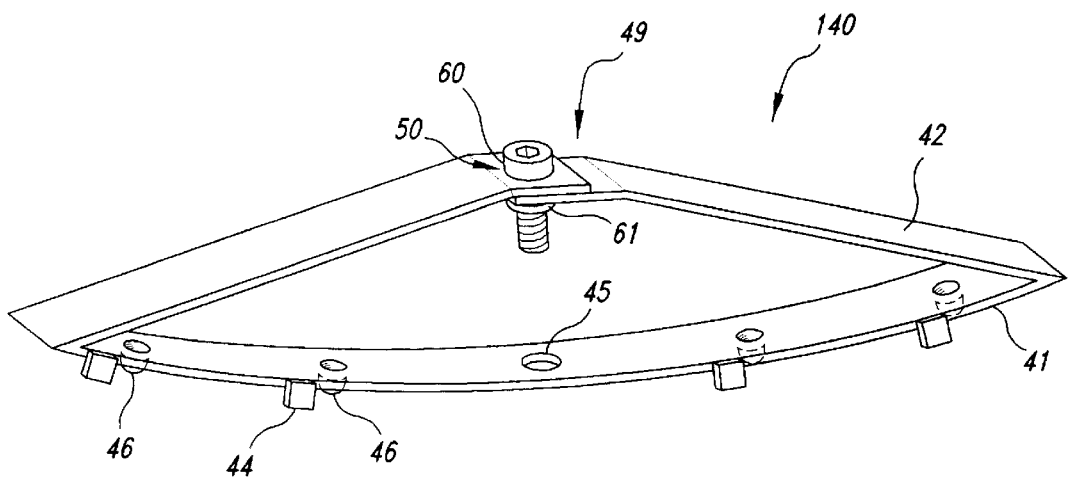
FIG. 3 is a top isometric view of another embodiment of the coupling device shown in FIG. 1.

FIG. 3 is an isometric view illustrating another embodiment of a coupling device 140 in which the engaging member 41 and the support member 42 are formed from a single strip. The ends of the strip may overlap at the intermediate portion 49 of the support member 42, where they may be welded or joined by other means. In another aspect of this embodiment, the ends of the strip forming the coupling device 140 may remain unconnected but may be held loosely in place relative to each other by the fastener 60 and the snap ring 61.

An advantage of the coupling device 140 shown in FIG. 3, when compared with the coupling device 40 shown in FIG. 1, is that the coupling device 140 may be simpler and less expensive to manufacture. Conversely, an advantage of the coupling device 40 is that it may have greater strength by virtue of its unitary construction.

Figure 4:
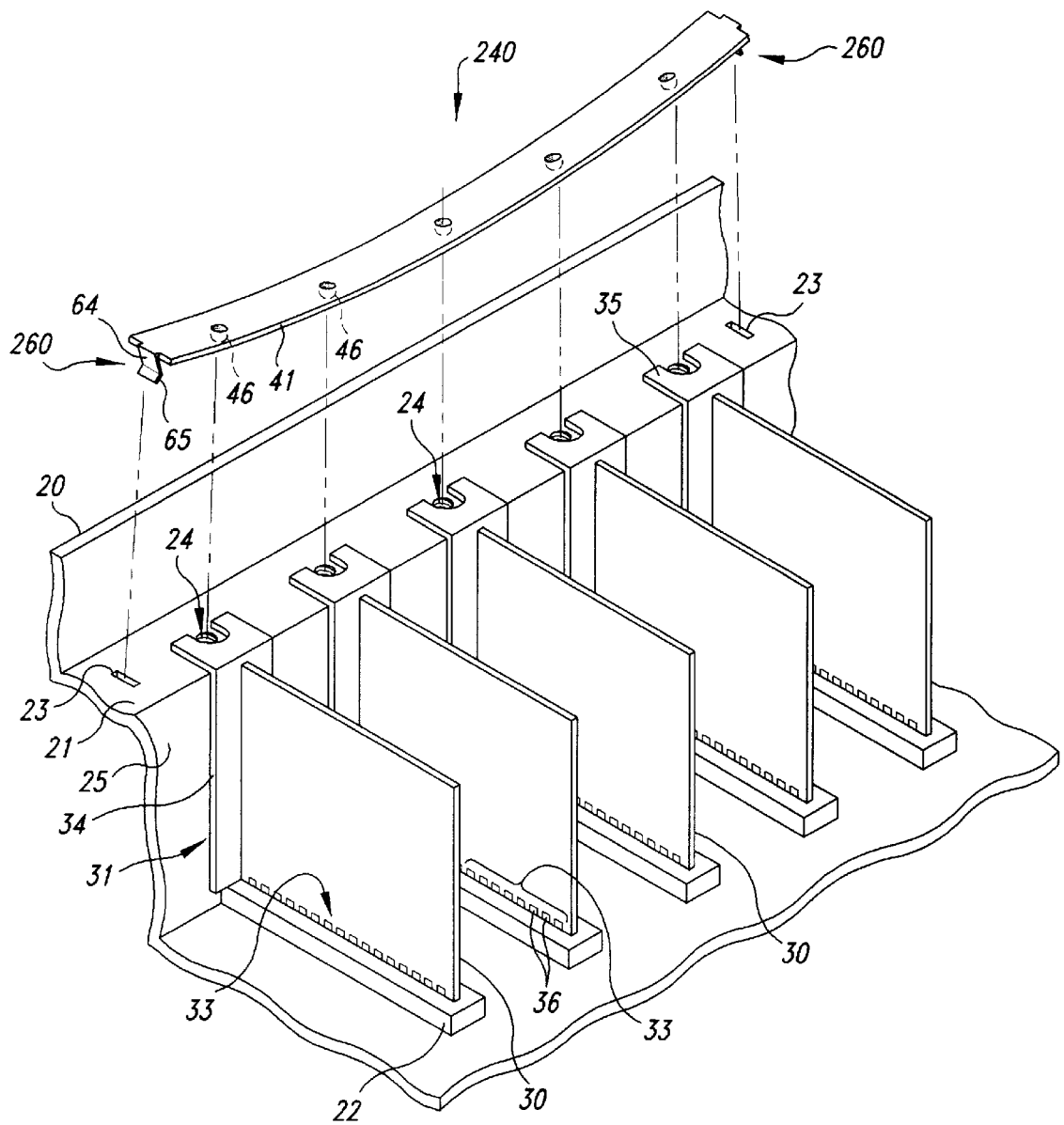
FIG. 4 is a top isometric view of a portion of a chassis and a coupling device in accordance with another embodiment of the invention.

FIG. 4 is a top isometric view of a chassis 20 and another coupling device 240 in accordance with another embodiment of the invention. As shown in FIG. 4, the mounting surface 21 of the chassis 20 includes slots 23 positioned at each end. The engaging member 41 of the coupling device 240 accordingly includes two engaging clips 260, one at each end, positioned to be received by the corresponding slots 23. Each engaging clip 260 may be a fastener that has an inwardly biased first portion 64 and an outwardly biased second portion 65. To attach the coupling device 240 to the chassis 20, the protrusions 46 of the engaging member 41 fit into the mounting apertures 214 and the clips 260 snap into the slots 3. When the engaging clips 260 are snapped into place, they bias the engaging member 41 toward the mounting surface 21. To remove the coupling device 240, the user may move the second portions 65 of the engaging clips 260 outwardly to release the coupling device 240 from the chassis 20.

An advantage of the coupling device 240 shown in FIG. 4 is that it may be attached to and/or removed from the chassis 20 without the use of tools. Accordingly, the likelihood that a user may inadvertently damage the PCBs 30 with a tool is substantially reduced. Furthermore, the coupling device 240 shown in FIG. 4 may be less expensive to manufacture because it does not include a support member or stiffener (FIG. 1). Conversely, an advantage of the coupling device 40 shown in FIG. 1 may be that it is fastened to an existing aperture 24, whereas the coupling device 240 shown in FIG. 4 may require that the chassis 20 be retrofitted with the slots 23.

Figure 5:
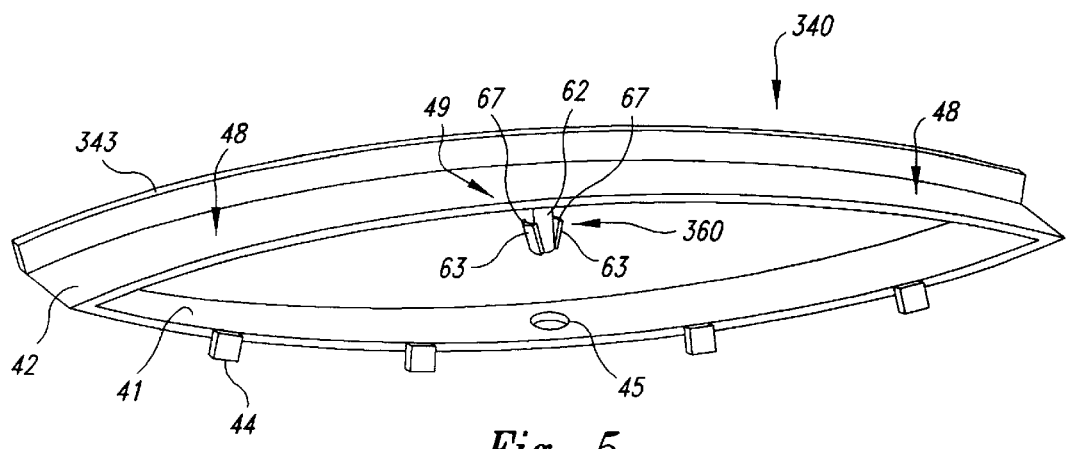
FIG. 5 is a top isometric view of a coupling device in accordance with yet another embodiment of the invention.

FIG. 5 is an isometric view of another coupling device 340 in accordance with still another embodiment of the invention having an expandable fastener 360. The expandable fastener 360 may be formed integrally with the support member 42, as shown in FIG. 5, or it may be a separate member that is attached to the support member in a manner similar to that shown in FIG. 1. As shown in FIG. 5, the fastener 360 man have a column 62 projecting downwardly from the support member 42, and two flaps 63 extending upwardly and outwardly from the lower end of the column 62. To attach the coupling device 340 to the chassis 20 (FIG. 1), the flaps 63 of the fastener 360 pass downward through the fastener aperture 45, the bracket aperture 32 (FIG. 1), and the mounting aperture 24 (FIG. 1). The flaps 63 accordingly fold inward toward the column 62 so as not to obstruct the passage of the column 62 through the apertures. Once the flaps 63 have passed beneath the mounting aperture 24, they spring radially outward so that the upper edges 67 of the flaps 63 engage the lower face 26 (FIG. 1) of the mounting surface 21 (FIG. 1).

As shown in FIG. 5, the coupling device 340 does not have protrusions projecting from the engaging member 41. Accordingly the brackets 31 do not require bracket apertures 32. When the coupling device 340 is attached to the chassis 20, the downward force exerted by the engaging member 41 on the brackets 31 (FIG. 1) may be sufficient to clamp the brackets 31 to the mounting surface 21 for holding the PCBs 30 to the chassis 20 (FIG. 1). Accordingly, the materials comprising the coupling device 340 may be stiffer than those comprising the coupling device 40 shown in FIG. 1. Alternatively, the components comprising the coupling device 340 may be assembled to provide a stiffer structure. For example, in the embodiment shown in FIG. 5, the vertical dimension of the stiffener 343 may be greater than the vertical dimension of the stiffener 43 shown in FIG. 1.

Figure 6:
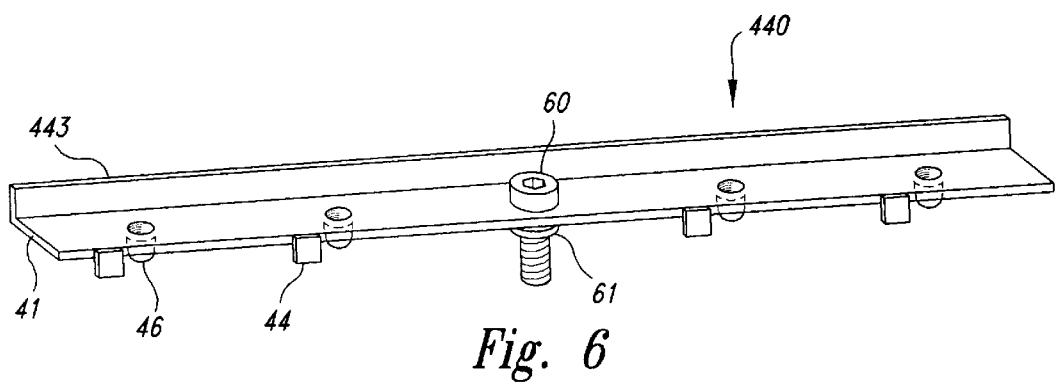
FIG. 6 is a top isometric view of a coupling device in accordance with still another embodiment of the invention.

FIG. 6 is an isometric view of a coupling device 440 having a substantially flat engaging member 41 and a fastener 60. The coupling device 440 does not include a support member 42 (FIG. 1). Accordingly, the coupling device 440 may be composed of a rigid material, or may include a stiffener 443. The stiffener 443 stiffens the engaging member 41 to inhibit or prevent the protrusions 46 from disengaging from the mounting apertures 24 of the chassis 20 (FIG. 1).

Figure 7:
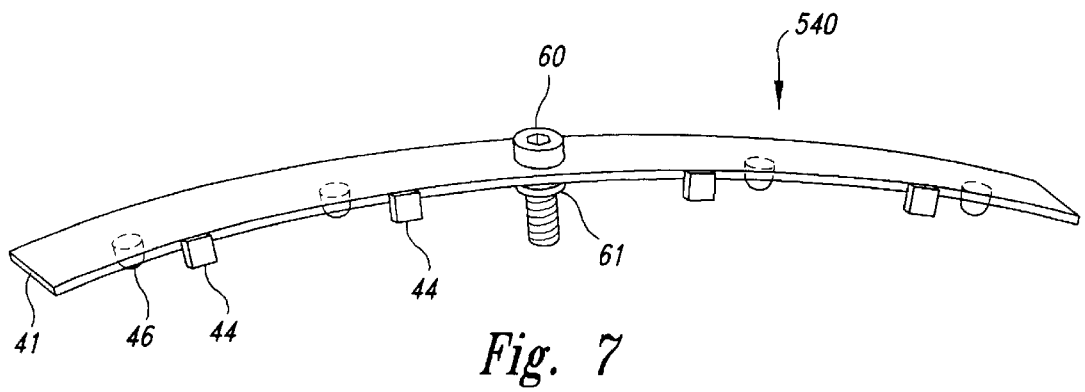
FIG. 7 is a top isometric view of an elongated coupling device having opposite ends biased in a first direction in accordance with another embodiment of the invention.

FIG. 7 is an isometric view of another coupling device 540 having a curved engaging member 41 in which the ends are biased downwardly in accordance with another embodiment of the invention. In one aspect of this embodiment, the ends of the engaging member 41 may be biased to such a degree that the coupling device 540 exerts a downward clamping force on the brackets 31 (FIG. 1) without the need for the support member 42 and stiffener 43 (FIG. 1), thus simplifying the construction of the coupling device 540.

Figure 8:
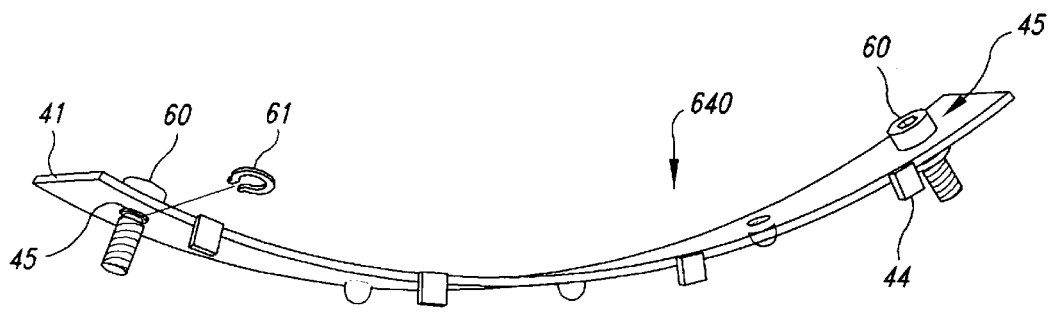
FIG. 8 is an isometric view of an elongated coupling device having opposite ends biased in a second direction in accordance with still another embodiment of the invention.

FIG. 8 is an isometric view of another coupling device 640 having another curved engaging member 41 with the ends biased upwardly in accordance with still another embodiment of the invention. As shown in FIG. 8, the coupling device 640 may have two fasteners 60 to secure the coupling device 640 in place on the mounting surface 21 of the chassis 20 (FIG. 1). Accordingly, the coupling device 640 may more uniformly clamp the brackets 31 between the mounting surface 21 and the coupling device 640.

Figure 9:
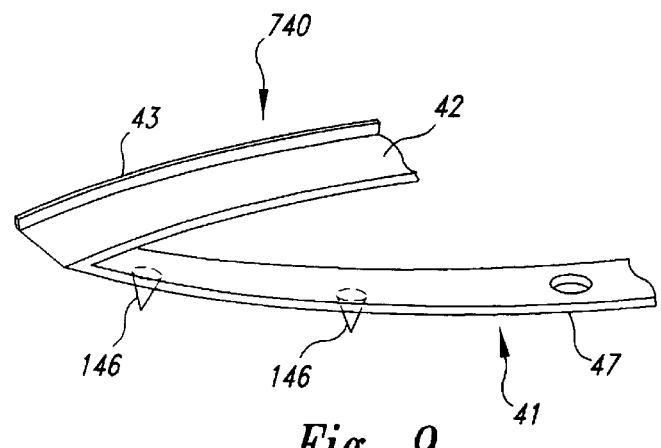
FIG. 9 is an isometric view of a portion of a coupling device having conical protrusions in accordance with still another embodiment of the invention.
Figure 10:
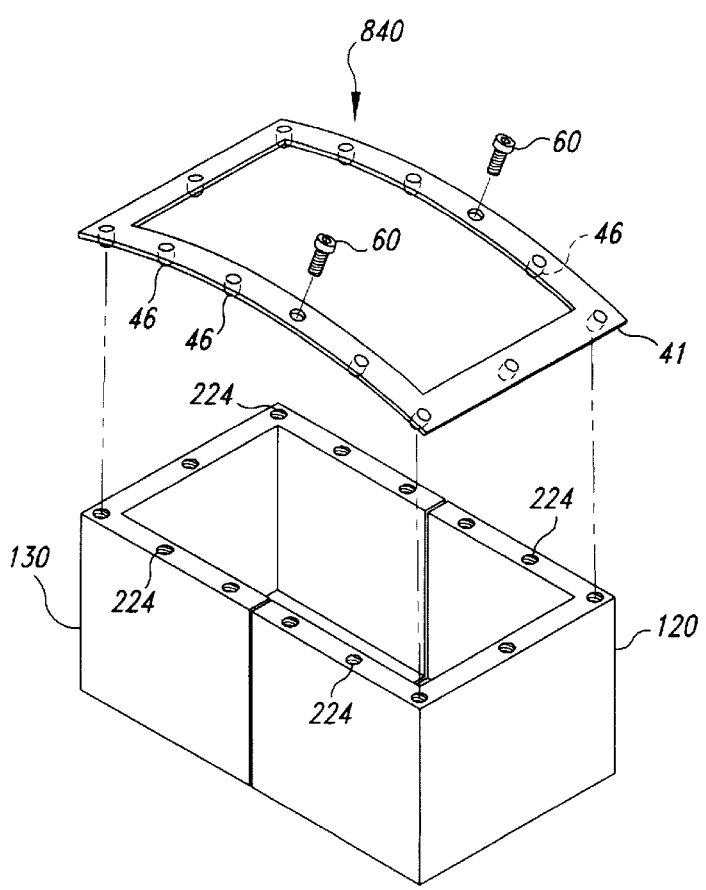
FIG. 10 is a top isometric view of first and second components positioned to be coupled together with a coupling device in accordance with yet another embodiment of the invention.

FIG. 9 is an isometric view of a portion of a coupling device 740 having conical protrusions 146 in accordance with another embodiment of the invention. The conical protrusions 146 are sized and shaped to extend a sufficient distance into the mounting apertures 24 (FIG. 1) to restrict motion of the coupling device 740 relative to the mounting surface 21 (FIG. 1) when the coupling device is connected to the chassis 20 (FIG. 1). In other embodiments, the protrusions 146 may have other shapes which may be removably received by the corresponding mounting apertures 24.

As shown in FIG. 9, the protrusions 146 may be separate elements that are bonded to the lower surface 47 of the engaging member 41. The protrusions 146 may be bonded to the engaging member 41 using any number of techniques, such as welding, soldering, adhesives or fasteners, to name a few. An advantage of the protrusions 146 shown in FIG. 9 is that they may be longer than the dimpled protrusions 46 shown in FIGS. 1–8 because the length of the dimpled protrusions may be limited by the thickness of the engaging member 41 (e.g., the engaging member 41 can be extruded only so much before it will fail). Conversely, an advantage of the coupling devices shown in FIGS. 1–8 having dimpled or extruded protrusions 46 is that they may be less expensive to manufacture then the coupling device 740 shown in FIG. 9.

As discussed above with reference to FIGS. 1–9 the coupling device may be used to restrict relative motion between the PCBs 30 and the computer chassis 20. Similar coupling devices in accordance with other embodiments may be used to couple other computer components using a combination of protrusions and fasteners in a manner generally similar to that discussed above. Coupling devices in accordance with still further embodiments of the invention may be used to couple any of a myriad of structures having mounting apertures arranged in any of a myriad of patterns. In one such embodiment, shown in FIG. 10, a coupling device 840 may be used to couple a first structure 120 and a second structure 130. The protrusions 46 extending away from the coupling device 40 may be positioned to engage corresponding apertures 224 in both the first structure 120 and the second structure 130, and one or more fasteners 60 may attach the coupling device 840 to the first and/or the second structures 120 and 130. The coupling device 840 accordingly restricts relative motion between the first structure 120 and the second structure 130. In addition to the engaging member 41 and fasteners 60, the coupling device 840 may further have a stiffener and support member, similar to those shown in FIG. 1.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A computer assembly, comprising:
   a chassis having a first aperture;
   a circuit board coupled to a bracket, the bracket having a second aperture coaxially aligned with the first aperture, the bracket being removably attached to the chassis;
   a coupling device having an at least partially flexible engaging member with first and second ends, the engaging member having an engaging surface between the first and second ends, the engaging surface being engaged with the bracket and being configured to flex from a bowed shape to a generally planar shape, the engaging member further having a protrusion extending away from the engaging surface and at least partially through the first and second apertures, the coupling device further including a support member having a first section connected to the first end of the engaging member, a second section connected to the second end of the engaging member, and an intermediate section between the first and second sections, the intermediate section spaced apart from the engaging member by a gap, the intermediate section being movable toward and away from the engaging member as the engaging member flexes to at least partially close the gap; and
   a fastener coupling the support member to the chassis with the bracket positioned between the engaging member and the chassis, the fastener driving the support member toward the engaging member and flexing the engaging member to insert the protrusion into the first and second apertures, and bias the engaging member against the bracket.

2. The assembly of claim 1 wherein the chassis has a fastening aperture and the fastener is sized and shaped to extend at least partially into the fastening aperture.

3. The assembly of claim 1 wherein the chassis has a threaded fastening aperture therein and the fastener is configured to threadably engage the threads of the fastening aperture to couple the engaging member to the chassis.

4. The assembly of claim 1 wherein the protrusion has a rounded surface.

5. The assembly of claim 1 wherein the protrusion has an at least partially spherical surface.

6. The assembly of claim 1 wherein the protrusion has an at least partially conical surface.

7. The assembly of claim 1 wherein at least one of the first and second apertures has an aperture diameter and the protrusion has a protrusion diameter, the protrusion diameter being less than the aperture diameter.

8. The assembly of claim 1 wherein the protrusion has a diameter generally equal to a diameter of the second aperture and the protrusion engages walls of the second aperture when the support member is coupled to the chassis.

9. The assembly of claim 1, further comprising a stiffening member connected along one edge to the support member and extending away from the support member to restrict motion of the protrusion away from the apertures when the protrusion is received by the apertures and the support member are coupled to the chassis.

10. The assembly of claim 1 wherein the protrusion is one of a plurality of protrusions.

11. The assembly of claim 10 wherein the engaging member is elongated between the first and second ends thereof and the plurality of protrusions is aligned along an axis extending between the first and second ends.

12. A device for restricting motion of a printed circuit board relative to a computer chassis, the printed circuit board being coupled to a mounting bracket, the chassis having first and second apertures therein, at least the first aperture being threaded, the device comprising:

an engaging member having a first end portion, a second end portion opposite the first end portion and an intermediate portion between the first and second end portions, the engaging member being flexible and resilient to flex from a bowed shape to a generally planar shape the engaging member having a protrusion aligned with the second aperture of the chassis when the engaging member is coupled to the chassis, the protrusion being sized and shaped to be removably received by the second aperture while at least a portion of the mounting bracket is positioned between the engaging member and the chassis;

a support member having a first end portion connected to the first end portion of the engaging member, a second end portion opposite the first end portion connected to the second end portion of the engaging member and an intermediate portion between the first and second end portions thereof, the intermediate portions of the engaging member and the support member facing each other and being spaced apart from each other to define a gap when the engaging member is detached from the first component, the intermediate portion of the engaging member being movable toward and away from the intermediate portion of the support member as the engaging member flexes from the bowed shape to the generally planar shape; and a fastener configured to couple the intermediate portion of the support member to the first aperture of the chassis.

13. The device of claim 12, further comprising at least one tab member attached to and extending away from the engaging member and positioned to engage the mounting bracket of the printed circuit board assembly and align the engaging member with the mounting bracket when the support member is coupled to the chassis.

14. The device of claim 12 wherein the protrusion has a rounded surface.

15. The device of claim 12 wherein the protrusion has an at least partially spherical surface.

16. The device of claim 12 wherein the protrusion has an at least partially conical surface.

17. The device of claim 12 wherein the second aperture has an aperture diameter and the protrusion has a protrusion diameter, the protrusion diameter being less than the aperture diameter.

18. The device of claim 12 wherein the mounting bracket has a bracket slot and the protrusion is sized to engage walls of the bracket slot when the support member is coupled to the chassis.

19. The device of claim 12 wherein the engaging member comprises an engaging surface positioned to engage the mounting bracket when the fastener couples the support member to the chassis, further comprising a stiffening member connected to the support member and having a stiffness in a direction approximately perpendicular to the engaging surface which is greater than a stiffness in a direction approximately in the plane of the engaging surface.

20. The device of claim 12 wherein the first aperture is threaded and the fastener comprises a threaded screw sized and shaped to threadably engage the first aperture.

* * * * *